United States Patent [19]

Horiuchi

[11] Patent Number: 5,712,204
[45] Date of Patent: Jan. 27, 1998

[54] METHOD OF MAKING A SEMICONDUCTOR DEVICE HAVING REDUCED JUNCTION CAPACITANCE BETWEEN THE SOURCE AND DRAIN REGIONS AND THE SUBSTRATE

[75] Inventor: Tadahiko Horiuchi, Tokyo, Japan

[73] Assignee: NEC Corporation, Tokyo, Japan

[21] Appl. No.: 575,475

[22] Filed: Dec. 20, 1995

[30] Foreign Application Priority Data

Dec. 21, 1994 [JP] Japan .................................. 6-341204

[51] Int. Cl.$^6$ .................................................. H01L 21/265
[52] U.S. Cl. .......................................... 438/307; 438/305
[58] Field of Search .................. 437/29, 34, 405 W, 437/41 CS, 41 SW, 44, 45, 56, 57, 59, 150; 438/304, 305, 307

[56] References Cited

U.S. PATENT DOCUMENTS

| | | | |
|---|---|---|---|
| 4,727,038 | 2/1988 | Watabe et al. | 437/29 |
| 4,994,404 | 2/1991 | Sheng et al. | 437/41 SW |
| 5,006,477 | 4/1991 | Farb | 437/44 |
| 5,030,582 | 7/1991 | Miyajima et al. | 437/45 |
| 5,102,816 | 4/1992 | Manukoda et al. | 437/34 |
| 5,200,351 | 4/1993 | Hadjizadeh-Amini . | |
| 5,218,221 | 6/1993 | Okumura . | |
| 5,234,850 | 8/1993 | Liao | 437/34 |
| 5,245,208 | 9/1993 | Eimori . | |
| 5,320,974 | 6/1994 | Hori et al. . | |
| 5,349,225 | 9/1994 | Redwine et al. | 437/44 |
| 5,525,823 | 6/1996 | Chan | 437/57 |

FOREIGN PATENT DOCUMENTS

| | | |
|---|---|---|
| 62-141778 | 6/1987 | Japan . |
| 3-43787 | 7/1991 | Japan . |

OTHER PUBLICATIONS

E. Takeda et al., "An As-P(n+-n-) Double Diffused Drain MOSFET for VLSI's", *IEEE Transactions on Electron Devices*, vol. ED-30, No. 6, Jun. 1983, pp. 652-657.

S. Ogura et al., "Design and Characteristics of the Lightly Doped Drain-Source (LDD) Insulated Gate Field-Effect Transistor", *IEEE Transactions on Electron Devices*, vol. ED-27, No. 8, Aug. 1980, pp. 1359-1367.

*Primary Examiner*—Brian Dutton
*Attorney, Agent, or Firm*—Young & Thompson

[57] ABSTRACT

A semiconductor device having a reduced junction capacitance of the source and drain and a method for manufacturing same. The method includes the steps of selectively forming an element separating region on a main surface of a <100> oriented semiconductor substrate of a first conductivity type, a step of providing a gate electrode on the region separated by the element separating region with an intervening insulating film, and a step of implanting impurities of a second conductivity type in regions under the source and drain regions using the gate electrode as a mask and with a predetermined angle of ion implantation to generate a channeling implantation condition.

8 Claims, 6 Drawing Sheets

METHOD OF MAKING A SEMICONDUCTOR DEVICE HAVING REDUCED JUNCTION CAPACITANCE BETWEEN THE SOURCE AND DRAIN REGIONS AND THE SUBSTRATE

BACKGROUND OF THE INVENTION

The present invention relates to a method of manufacturing a semiconductor device and particularly to a method of manufacturing a Metal Insulator Semiconductor (MIS) type field effect transistor (FET) which has a reduced junction capacitance between the source and drain regions and the substrate, respectively.

In a semiconductor circuit device having integrated MIS type FETs, the parasitic capacitance inherent in the MIS-FETs has a large influence on the speed or operational frequency of the circuit. Particularly, junction capacitances between the diffused source and drain layers and the substrate in the MIS type field effect transistor play an important role and it is preferable that these junction capacitances are made as small as possible in order to improve the circuit performance.

However, assuming the impurity concentration in the semiconductor substrate to be uniform, lowering the impurity concentration of the diffused source and drain layer to reduce the Junction capacitance, leads to punch-through between the source and drain layers resulting in the FBT's operation failure.

Various methods to solve the problems explained above have been proposed, for example, in the Japanese Patent Laid-Open Nos. HEI 3-437117 and SHO 62-141778.

Figure 7A:
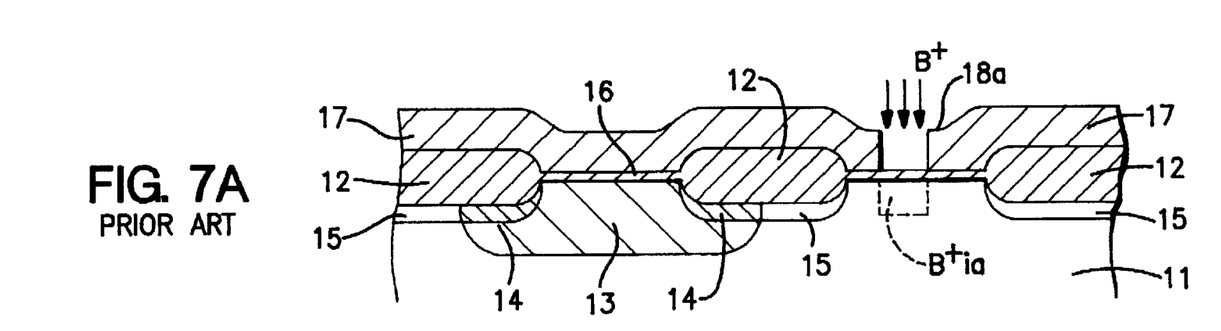
FIG. 7a to 7c illustrate cross-sectional views for explaining the processes steps for manufacturing semiconductor devices of the prior art.
Figure 7B:
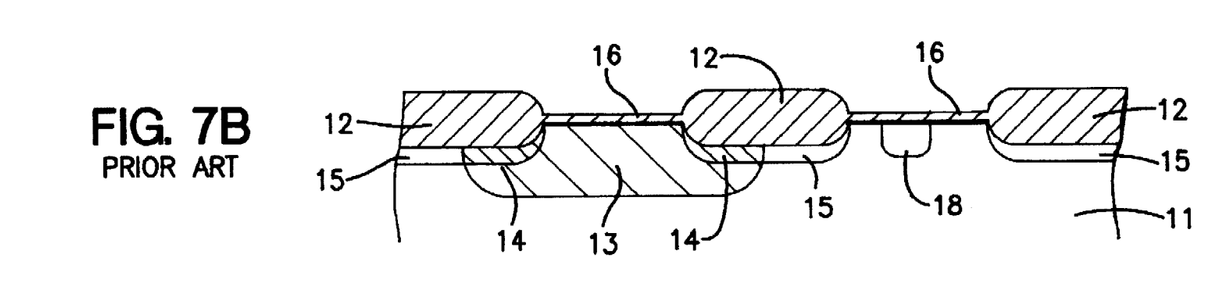
Figure 7C:
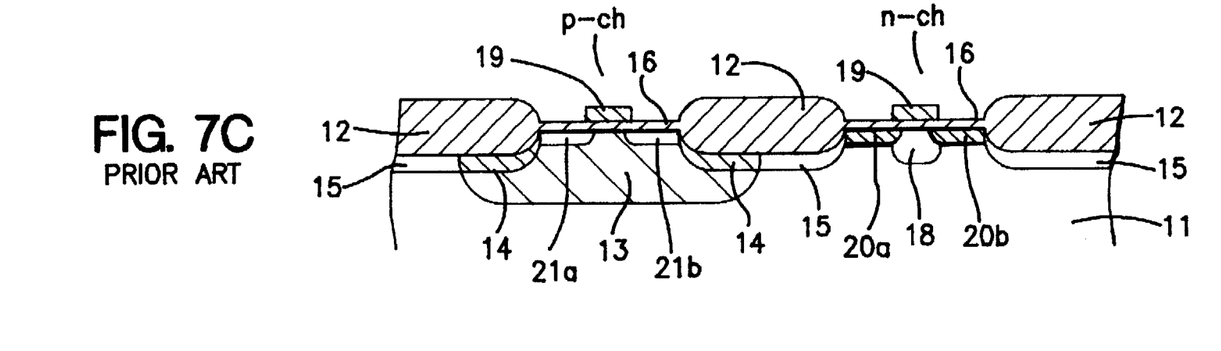
Figure 8A:
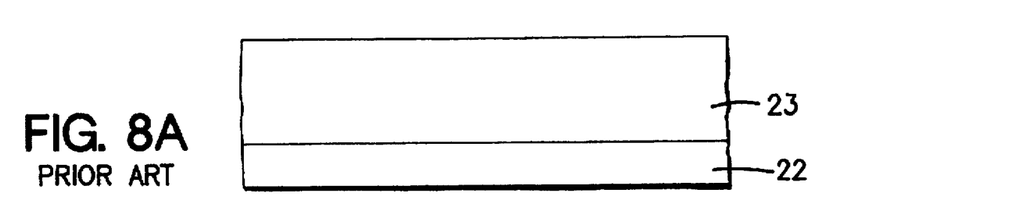
FIG. 8a to 8c illustrate cross-sectional views for explaining another process for manufacturing semiconductor devices of the prior art.
Figure 8B:
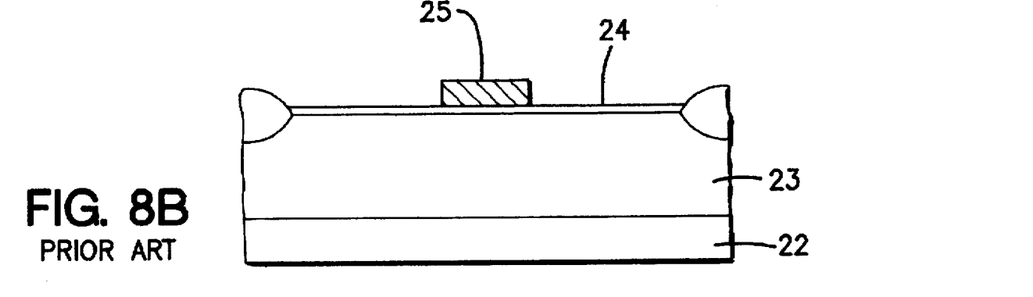
Figure 8C:
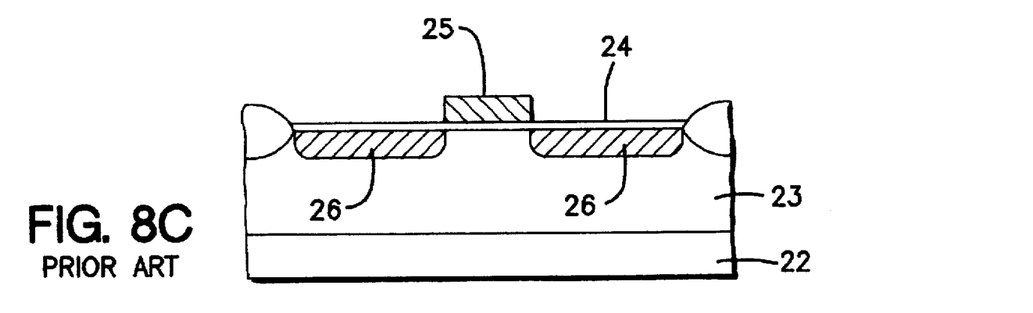

The former reference, the Japanese Patent Laid-Open No. HEI 3-43787 (the 43787 reference) discloses a complementary metal oxide semiconductor (CMOS) device as depicted in FIGS. 7a–7c. In this CMOS device, a region of one conductivity type having an impurity Concentration higher than the semiconductor substrate and a depth deeper than the source and drain regions is selectively formed in the semiconductor substrate immediately under the Sate electrode and in its proximity. As shown in FIGS. 7a–7c, the MIS-FET has a doped channel only in the area immediately under the gate electrode between the source and drain regioris. This channel doping is performed by a conventional photolithographic masking process.

In more detail, referring to FIGS. 7a–7c, numeral 11 denotes a p-type semiconductor substrate; 12, a field oxide film; 13, an n-type well; 14, a n+ type channel cut region (channel stopper); 15, a p- type channel cut region (channel stopper); 16, a gate oxide film; 17, a resist mask; 18, a channel-doped region (p type region); 19, a gate electrode; 20a, 20b, n-type source and drain diffused layers; and 21a, 21b, p-type source and drain diffused layers. As shown in FIG. 7a, the surface is covered by a photoresist mask with an opening arranged over a region where an n-channel transistor is to be formed. The opening serves as an ion implantation window 18a which has a width a little larger than the width of a gate electrode. Boron ions (B+) are selectively implanted into the substrate through a gate oxide film 16 via the ion implantation window 18a to form a boron implanted region $B_{ia}$. The boron implanted region $B_{ia}$ extends in to the substrate deeper than the source and drain regions and has a predetermined concentration sufficient to prevent punch-through. After implantation, this implanted region $B_{ia}$ is activated by heat treatment to be a p-type region (channel doped region) 18, as shown in FIG. 7b. Finally, as shown in FIG. 7c, a p-type source diffused layer 21a and a p-type drain diffused layer 21b are formed on the surface of an n-type well 13. Further, an n-type source diffused layer 20a and an n-type drain diffused layer 20b are formed on the surface of the p-type semiconductor substrate 11 with their respective gate side lateral extent ending slightly in the p-type region 18.

In this construction, the bottom parts of the source and drain diffused layers come in contact with the substrate having a low impurity concentration, and therefore the junction capacitance formed there becomes small.

The latter reference, the Japanese Patent Laid-Open No. SHO 62-141778 (the 141778 reference) discloses an insulated gate type field effect transistor comprising semiconductor layers lying under the source and drain regions and forming pn junctions therewith. The lateral extent of these semiconductor layers do not extend to portions beneath the channel region. The impurity concentration of these semiconductor layers is an intermediate one lying between that of the source and drain regions and the semiconductor substrate. Namely, the 141778 reference discloses a MIS type FET and a method of manufacturing the same, wherein the junction capacitance is reduced because the lower part of the source and drain regions are depleted.

FIGS. 8a–8c and FIGS. 9a–9c illustrate cross-sectional views of a semiconductor device for explaining the manufacturing processes of a semiconductor device disclosed in the 141778 reference. In FIG. 8a–8c and FIGS. 9a–9c, numeral 22 denotes a p-type semiconductor substrate; 23, a p-type well; 24, a gate oxide film; 25, a gate electrode; 26, an n-type diffused layer; 27, an oxide film side wall; 28, n-type source and drain regions; 29, an interlayer insulating film; 30, a contact hole; 31, a phosphorus counter doped region (low concentration p-type layer); 32, an aluminum wiring; and 33, a channel region.

Figure 9A:
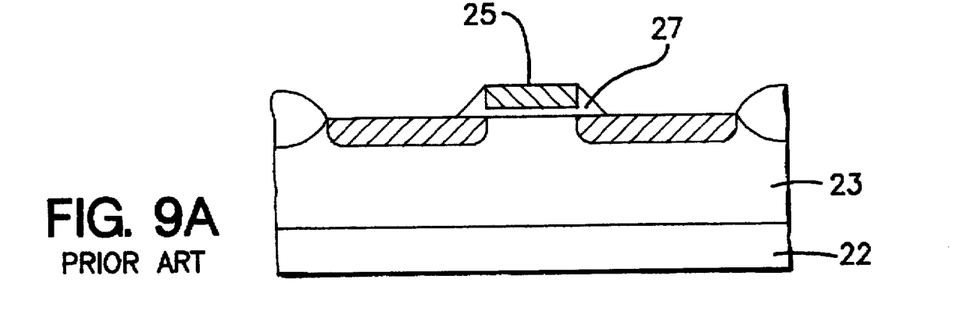
FIGS. 9a to 9c is in succession to FIG. 8c, illustrating crosssectional views for explaining the another process for manufacturing semiconductor devices of the prior art.
Figure 9B:
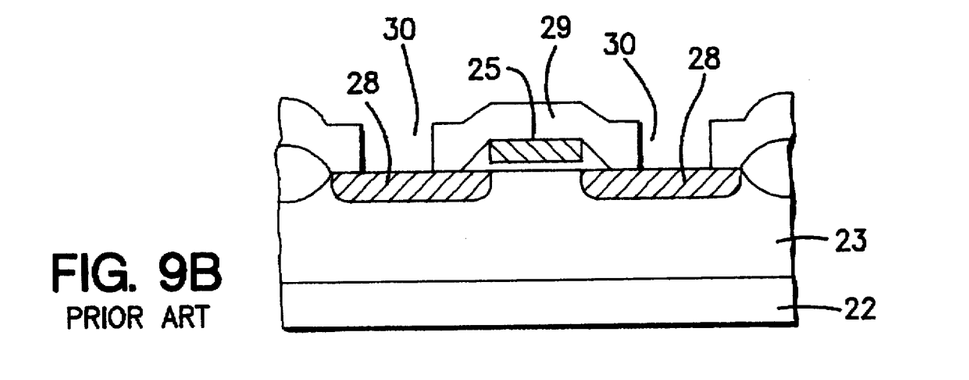
Figure 9C:
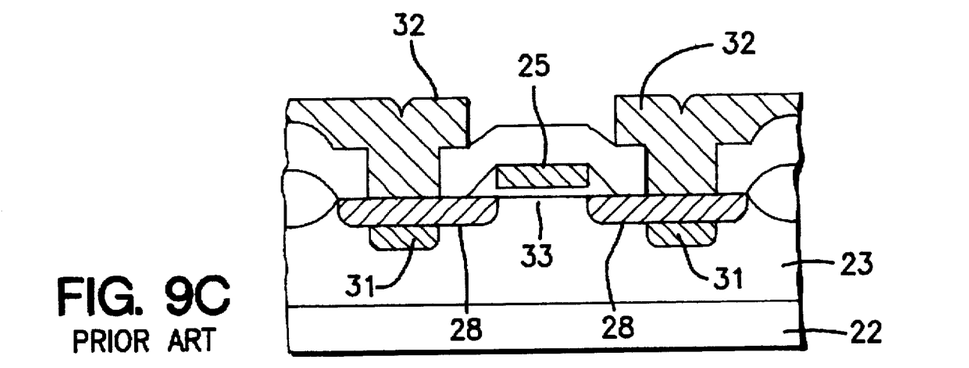

By referring to FIG. 9a–9c, n-type source and drain diffused layers 28 which will later become the source and drain regions are formed. After implanted arsenic is activated by a heat treatment, a silicon dioxide film is deposited on the entire surface as an interlayer insulating film 29. A contact hole 30 reaching the n-type source and drain diffused layers 28 is opened by a photolithographic method or the like as shown in FIG. 9b. Then, as shown in FIG. 9c, phosphorus ions are implanted into the p-type well region 23 under the n-type source and drain diffused layers 28 through the contact hole 30. The impurity concentration of the relevant portion of the p-type well 23 is lowered and further a low concentration p-type layer 31 is formed beneath the n-type source and drain diffused layers 28. That is, by compensating the impurities of the substrate through ion implantation of another impurity of the same conductivity type as that of the source and drain regions, the effective impurity concentrations in the source and drain regions are lowered resulting in a reduced junction capacitance. Or, alternatively, new low concentration source and drain regions are provided under the initial source and drain regions by such ion implantation. When, these low concentration source and drain regions are depleted, a junction capacitance formed therein can be reduced.

However, the prior art described above have problems as will be explained hereafter.

In the 43787 reference, the photolithographic masking process aimed at limiting the region of channel doping and the photolithographic masking process aimed at forming the gate electrode are carried out individually. Since displacement in positioning of windows for both photolithographic masking processes is actually inevitable, the window width of the photolithographic mask for limiting the channel doping region must be set wider than the window width for the gate electrode to allow for proper positioning. Since the channel doping region and the source and drain regions overlap as much as this positioning allowance, there rises a problem, in that a junction capacitance of this region increases.

Moreover, in the manufacturing method described in the 1417/8 reference, low capacitance source and drain diffused layers can be obtained only at areas just under the contact hole. It is impossible to form a contact hole that is unlimited in width, since some allowance for positioning must be left between the contact hole and the gate electrode. Accordingly, it is impossible to ensure a low capacitance for the entire width of the source and drain regions.

SUMMARY OF THE INVENTION

The present invention has been proposed considering the problems of the prior art described above and it is therefore an object of the present invention to provide a semiconductor device which has reduced junction capacitance of the source and drain and a method of manufacturing the same semiconductor device.

In order to achieve the object mentioned above, a method of manufacturing a semiconductor device of the present invention comprises (a) a process step to selectively form an element separating region on the main surface of a <100> oriented semiconductor substrate of a first conductivity type; (b) a process step to provide a gate electrode on the region separated by the element separating region with an intervening insulating film and (c) a process step to implant impurities of a second conductivity type in regions under the source and drain regions using the gate electrode as a mask and with a predetermined angle of ion implantation to generate a channeling implantation condition.

In the present invention, it is preferable that ions are implanted within an angle about two (2) degrees off from the <100>orientation of the semiconductor substrate.

In the present invention, if insulating films are to be formed on the source and drain regions prior to the ion implantation, the thickness of insulating film is preferably set to approximately 3 nm or less during the ion implantation process of the second conductivity type impurities.

According to another preferable aspect of the present invention, the temperature of the semiconductor substrate is set to approximately −50° C. or lower at the time of the ion implantation of the second conductivity type impurities.

In the present invention, impurity atoms are implanted only into the necessary regions by intentionally utilizing the channeling condition of ion implantation. The angle of ion implantation, thickness of the overlying gate oxide film (screening film) and temperature of the semiconductor substrate at the time of ion implantation determine the degree of channeling of the implanted ions.

DESCRIPTION OF THE PREFERRED EMBODIMENTS

The preferred embodiments of the present invention will be explained with reference to the accompanying drawings.
[Embodiment 1]

FIGS. 1a to FIG. 3 illustrate cross-sectional views of a semiconductor device at each process step for explaining a manufacturing method of an embodiment of the present invention.

Figure 1A:
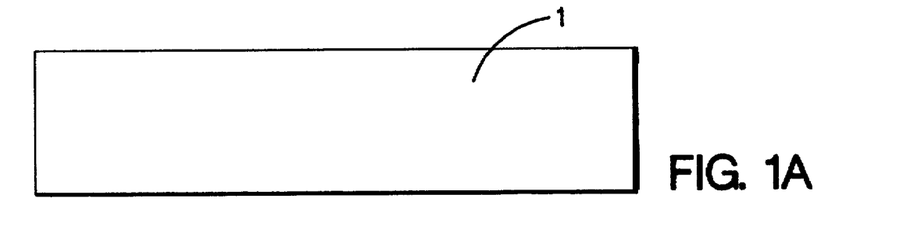
FIGS. 1a to 1c are sequential cross-sectional diagrams illustrating steps of a manufacturing method in relation to a first embodiment of the present invention.

First, as shown in FIG. 1a, a p-type silicon substrate 1 is prepared. The impurity concentration of the substrate is set at $1\times10^{17} cm^{-3}$. Alternatively, a p-type well having a concentration of $1\times10^{17} cm^{-3}$ may be formed in the substrate whose impurity concentration is $1\times10^{15} cm^{-3}$. This p-type silicon substrate 1 has a (100) surface orientation.

Figure 1B:
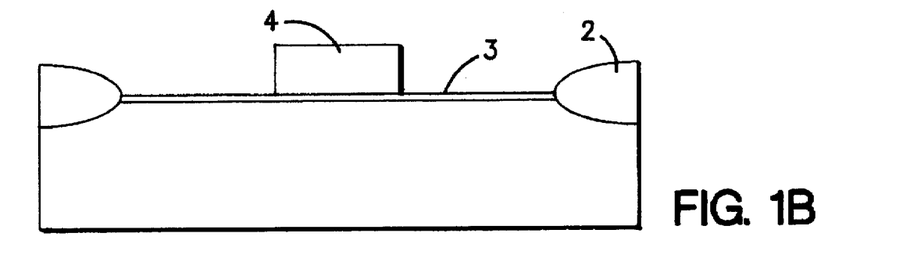
Figure 1C:
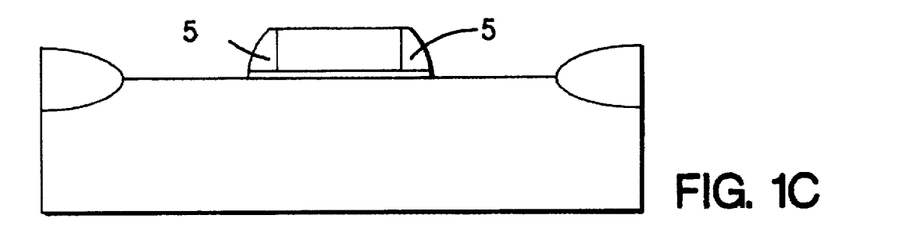

Next, as shown in FIG. 1b, a field oxide film 2 of a thickness of about 250 to 400 nm is formed by the well known LOCOS method on the main surface of the p-type silicon substrate 1. After a gate oxide film 3 of a thickness of about 5 to 12 nm is formed by thermal oxidation in the region separated by the field oxide films 2, a polycrystalline silicon film of a thickness of about 10 to 20 nm is deposited thereon. This polycrystalline silicon film is patterned by photolithography, and a dry etching method to form a gate electrode 4. As the gate electrode material, a refractory metal silicide or a polycide may be used in place of the polycrystalline silicon.

Next, an oxide film having a thickness of about 100 to 200 nm is deposited by a chemical vapor deposition (CVD) method. This oxide film is etched by a dry etching method to provide a side wall oxide film 5 at the side wall section of the gate electrode 4 (refer to FIG. 1c).

Figure 2A:
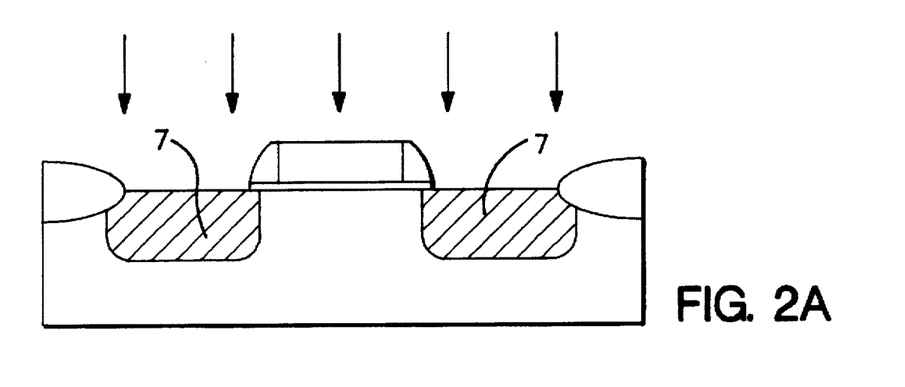
FIGS. 2a and 2b are sequential cross-sectional diagrams in succession to that shown in FIG. 1c, illustrating steps of a manufacturing method in relation to a first embodiment of the present invention.

Next, while silicon is exposed in the region where the source and drain regions are to be formed, phosphorus ions 6 are implanted at normal to the substrate surface, i.e., with an implantation angle of 0 (zero) degree, and an energy of 35 keV and dose of $3.2\times10^{12} cm^{-2}$ (refer to the phosphorus ion implantation region 7 of FIG. 2a).

Next, the surface of the source and drain diffused regions are thermally oxidized and arsenic ions are implanted thereto with an energy of 15 key and dose of $2\times10^{15} cm^{-2}$. The structure is then subjected to a heat treatment at about 950° C. for about 10 seconds to obtain the source and drain diffused layer 8 (refer to FIG. 2b).

Figure 3:
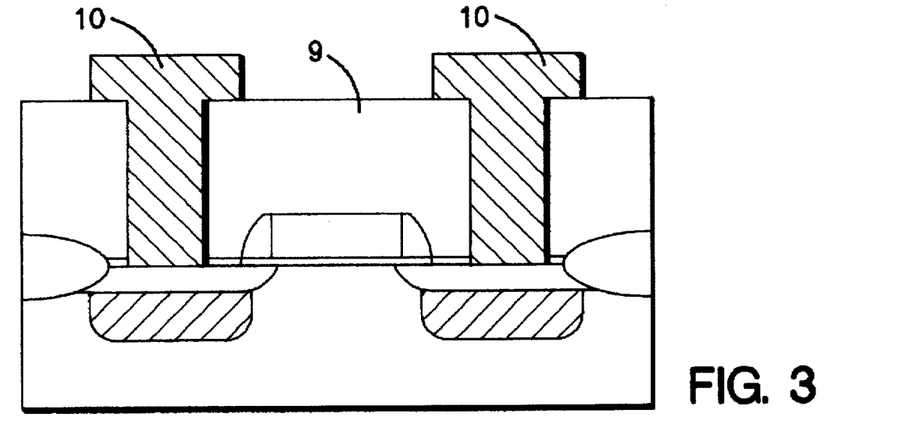
FIG. 3 is a sequential cross-sectional diagram in succession to that shown in FIG. 2b, illustrating a manufacturing method in relation to a first embodiment of the present invention.

Next, as shown in FIG. 3, an interlayer insulating film 9 is formed and aluminum wiring 10 are connected via contact holes formed in the interlayer insulating film 9, thereby completing a field effect transistor.

In the process step depicted in FIG. 2a, distribution of ions implanted in the silicon substrate is sensitive to the implantation angle. When the implantation angle is at 0 degrees, ions are implanted deep into the p-type silicon substrate 1 by means of channeling. Namely when the implanting ion beam direction matches the crystal axis of, for example, a semiconductor substrate, a so called channeling phenomenon occurs and ions penetrate along the crystal axis reaching a depth much deeper than the projected range Rp.

Meanwhile, since the field oxide film 2 constituting element separating regions is amorphous, channeling is not generated during ion implantation. Since the gate electrode is formed of polycrystalline silicon, the crystal axis is deviated to a large extent from the angle of ion implantation and channeling is not generated during ion implantation.

Therefore, using channeling, impurities are deeply doped under the source and drain diffused layers 8 to form regions 7, which have one side in contact with the bottom part of the source and drain diffused layers. Since channeling is not generated in the regions where impurities should not be doped, such regions are not doped. Due to this mechanism, impurities in the substrate is compensated by phosphorus only at regions beneath the source and drain diffused layers 8 to reduce the effective carrier concentration of the substrate.

Under the conditions of this embodiment, the effective carrier concentration of the substrate is reduced to $2 \times 10^{16} cm^{-3}$ and a junction capacitance of the source and drain diffused layers can be reduced accordingly.

Moreover, since implanted ions are not excessively scattered in the lateral direction when channeling is generated, almost no phosphorus ions are incorporated into the channel region of the transistor. Therefore no changes occur in the electrical characteristics such as threshold voltage and short channel effect of the transistor.

One of the aspects of the present invention is that the ion implantation process for obtaining a low carrier concentration in the substrate is performed in a self-aligned fashion with respect to the gate electrode. Therefore, device performance is not deteriorated due to the positioning allowance described with regard to the prior art.

We will now discuss the effects of implantation angle, screening oxide film thickness, and substrate temperature. An attempt to introduce ions into the substrate by simply increasing the ion implantation energy encounters problems not only that, ions force through the gate electrode and the field oxide film resulting in deterioration of the electrical characteristics of a transistor but also that impurity distribution inside the channel is altered by ions scattered to the channel side from the source and drain side during ion implantation. Therefore, in view of realizing the effect of the present invention as explained previously, it is necessary to generate channeling at the time of ion implantation and to obtain an impurity distribution which is as flat as possible in the depth direction.

For instance, since a depletion layer width of an abrupt junction (stair-case junction) is about 0.2 μm for a substrate concentration of $1 \times 10^{17} cm^{-3}$, variation of impurity concentration must be kept at about $1 \times 10^{16} cm^{-3}$ or less within a range of about 0.2 μm. If not, the process for compensating for the impurity of one conductivity type with the impurity of inverse conductivity type will not work effectively.

Figure 4:
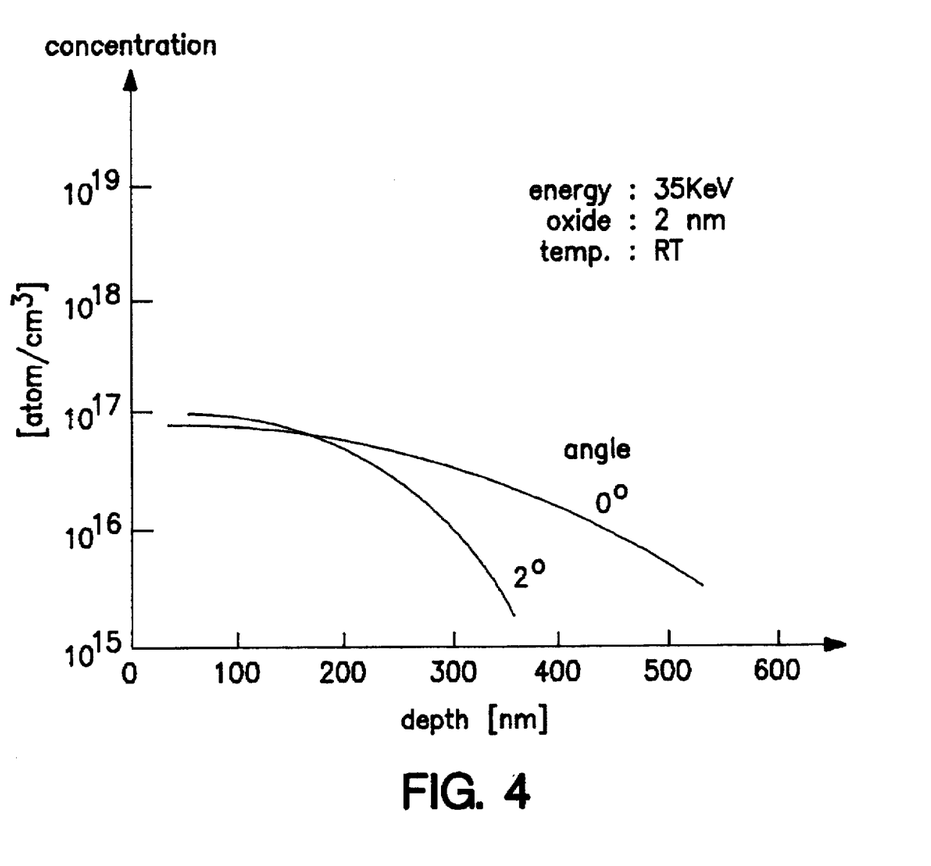
FIG. 4 is a diagram showing depth-wise distribution of implanted phosphorus ions for two ion implantation angles.

FIG. 4 shows ion implantation angle dependence of the implanted impurity distribution. As shown in the same figure, it can be understood that desired channeling will not occur unless the ion implantation angle is substantially kept below two degress.

Figure 5:
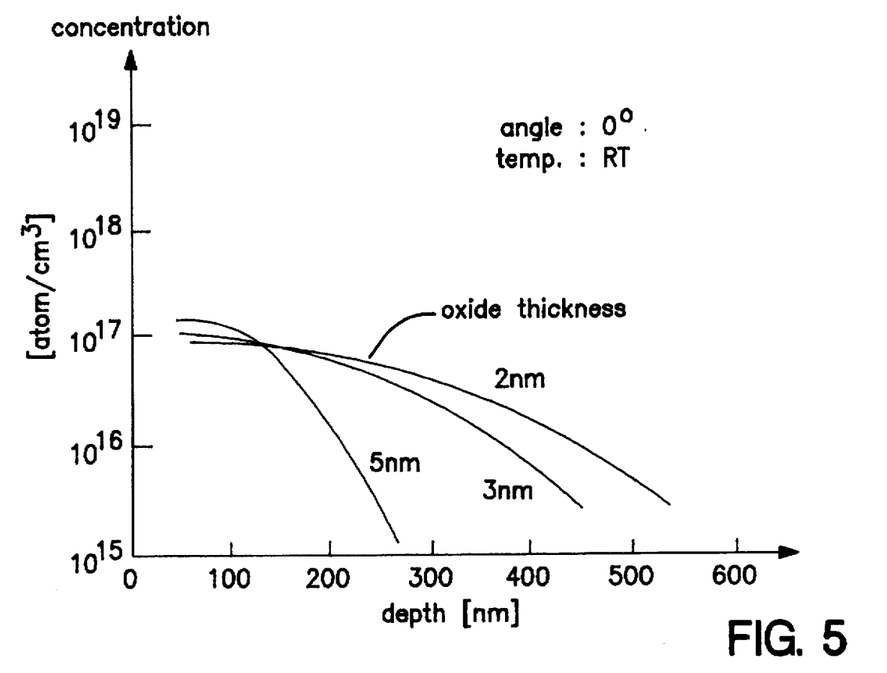
FIG. 5 is a diagram showing depth-wise distribution of implanted phosphorus ions for three different thicknesses of a screen oxide film.

FIG. 5 shows screening oxide film thickness dependence of the implanted impurity distribution. By referring to FIG. 5, desired channeling will not occur unless the thickness of the screening oxide film is substantially set to 3 nm or less. Here, the screening oxide film is provided to prevent contamination by, for example, metal atoms from the vacuum chamber of the ion implantation apparatus during the ion implantation process. This screening oxide film is formed by depositing a silicon oxide film on the source and drain regions, and is then removed by etching after the ion implantation. It should be noted that in the process shown in FIG. 2a, the screening oxide film is not provided and phosphorus ions are implanted directly to the silicon substrate surface.

Figure 6:
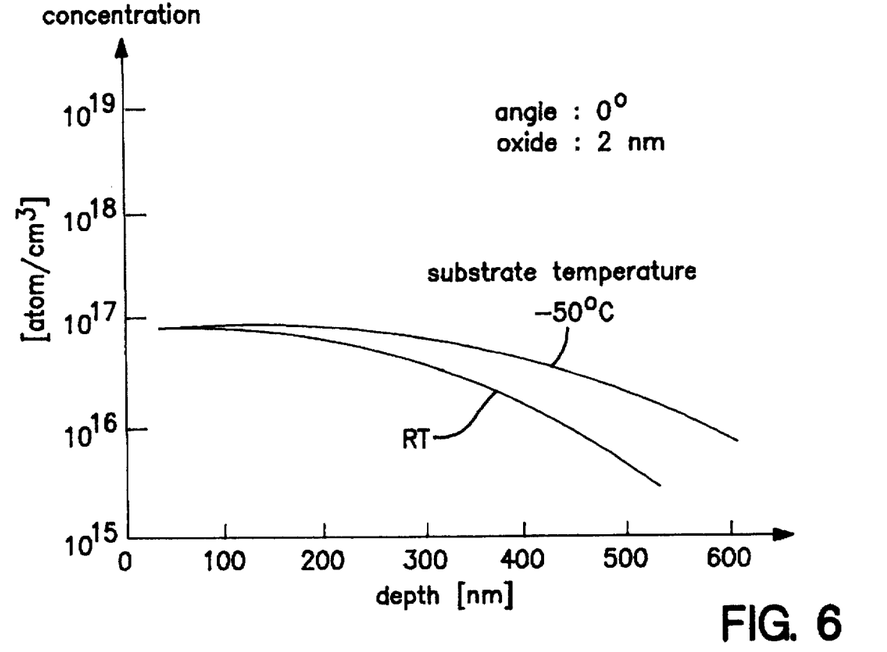
FIG. 6 is a diagram showing depth-wise distribution of implanted phosphorus ions for two substrate temperatures.

FIG. 6 shows the dependence of the implanted impurity distribution on the substrate temperature during implantation. The effect of the present invention can be further enhanced by setting the substrate temperature to about –50°C.

In the embodiment just explained, an n-channel transistor was exemplified, but, it is of course possible to apply the present invention to a p-channel transistor with proper alterations. Also, in this embodiment, an example of a process where impurity atoms are doped by implanting ions into a region under a region that is to become the source and drain diffused layers prior to the formation of such source and drain diffused layers was explained. However, the impurity ions may be implanted to the same region after the formation of the source and drain diffused layers;

[Embodiment 2]

Figure 2B:
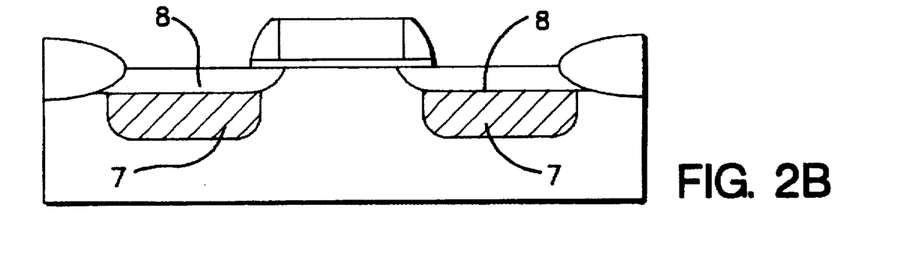

As a second embodiment of the present invention, an example of forming an n-type region as the phosphorous implanted region 7 of FIG. 2b will be explained.

In this case, the mount of phosphorus ions to be implanted is substantially changed from that of the first embodiment to $3.5 \times 10^{12} cm^{-2}$. Region 7 functions as as low concentration source and drain diffused layers Since the depletion layer width is substantially large under ordinary bias conditions, the source and drain diffused layers have a low capacitance.

The MIS type FET of this embodiment is significantly different from transistors having the well known Double Diffused Drain (DDD) structure (see for example "An As-P(n+–n–) Double Diffused Drain MOSFET for VLSI's", E. Takeda et al., IEEE Trans. Electron. Devices Vol. ED-30, pp. 652–657, Jun. 1983) or the Lightly Doped Drain (LDD) structure (see for example "Design and Characteristics of the Lightly Doped Drain-Source (LDD) Insulated Gate Field Effect Transistor", S. Ogura et al., IEEE Trans. Electron. Devices Vol. ED-27, pp. 1359–1367, Aug. 1980).

One difference is in the effect of the implanted phosphorous. Owing to the deeply implanted phosphorous, the DDD or LDD structured transistors have increased junction breakdown voltage and improved. resistance to hot carrier effects. On the other hand, in this embodiment, the ion implanted phosphorus has almost no influence on the electrical characteristics of the transistors because the phosphorus ions do not invade into the channel region. Another difference is in the magnitude of the source/drain to substrate junction capacitance. In a typical DDD structure, a high n-type impurity concentration source or drain region is surrounded by a relatively lower n-type impurity concentration region so as to increase the source to drain junction breakdown voltage. Since the impurity concentration of the substrate is somewhat less than $1 \times 10^{17} cm^{-3}$ in the $10^{16}$ range, and that of the surrounding lower n-type region is of the order of $10^{17}$ to $10^{18}$ cm$^{-3}$, which is still even higher than the substrate, the junction capacitance created between the lower n-type region and the substrate is large. In case of a typical LDD structure, the impurity concentration of the substrate is also in the $10^{16}$ range, while that of the highly concentrated n-type source or drain region that primarily affects the junction capacitance is of the order of $10^{16}$ to $10^{20}$cm$^{-3}$. Therefore, in case of the LDD transistor, the junction capacitance created is larger than the DDD transistor. In the instant invention, however, since the impurity ions are implanted into the substrate using the channeling implantation technique, an effective substrate impurity concentration as low as $2 \times 10^6$ cm$^{-3}$ is achieved. Therefore, the junction capacitance which is created between this substrate and the source and drain diffusion regions can be significantly smaller than the DDD or LDD transistors.

As explained previously, the methods of manufacturing a semiconductor device of the present invention is characterized in that the substrate carrier concentration of the region just under the source and drain is controlled by intentionally utilizing ion channeling for ion implantation so that the depletion layer width of the source and drain junctions are widened resulting in reduction of the junction capacitance. These processes are performed in self-alignment to the gate electrode so that they do not have any problem of mask positioning accuracy as well as increase in the number of process steps.

I claim:

1. A method of manufacturing a semiconductor device, comprising the steps of:

forming a gate electrode on a substrate of a first conductivity type, said substrate having a first carrier concentration;

implanting first impurity ions of a second conductivity type into said substrate, said second conductivity type being opposite to said first conductivity type, using said gate electrode as a mask, at a concentration to create a first region of said substrate retaining said first conductivity type and having a second carrier concentration; and implanting second impurity ions of said second conductivity type into said substrate using said gate electrode as said mask, at a concentration to create a second region of said substrate having said second conductivity type, said second region overlying said first region;

wherein said first carrier concentration is higher than said second carrier concentration.

2. The method according to claim 1, wherein said first impurity ions and said second impurity ions are different chemical species.

3. The method according to claim 2, wherein said first impurity ions are phosphorus ions and said second impurity ions are arsenic ions.

4. The method according to claim 2, wherein said substrate has a (100) surface orientation.

5. The method according to claim 1, wherein said step of implanting first impurity ions is performed at an angle to a main surface of said substrate.

6. The method according to claim 5, wherein said angle is not more than about 2° from a plane perpendicular to said main surface.

7. The method according to claim 1, further comprising the step of forming an insulating film on a surface of said substrate prior to formation of said first region, said insulating film having a thickness of about 3 nm or less.

8. The method according to claim 1, wherein said substrate is maintained at a temperature of about −50° C. during said step of implanting first impurity ions.

* * * * *